INTEGRAL CABLE AND CONNECTOR

Filed May 6, 1958 2 Sheets-Sheet 1

Sidney K. Tally
*INVENTOR*

Feb. 28, 1961 S. K. TALLY 2,973,502

INTEGRAL CABLE AND CONNECTOR

Filed May 6, 1958 2 Sheets-Sheet 2

Sidney K. Tally
*INVENTOR*

United States Patent Office 2,973,502

Patented Feb. 28, 1961

2,973,502

INTEGRAL CABLE AND CONNECTOR

Sidney K. Tally, Nashua, N.H., assignor to Sanders Associates, Inc., Nashua, N.H., a corporation of Delaware Filed May 6, 1958, Ser. No. 733,316

2 Claims. (Cl. 339—61)

The present invention relates to printed circuit articles such as flexible cabling utilizing copper conductors bonded to a wide range of plastic materials. More particularly, this invention relates to flexible printed circuit cables having a unique conductor structure.

Typically, flexible printed circuit cables are formed from flat, relatively thin sheets of plastic material having embedded therein flat, thin conductors all in the same plane or, at most, in a few superimposed planes. In one form of such a cable, the conductors are of uniform width and are separated uniformly. The present invention is directed to an improvement in such printed circuits by providing a solution for the problems arising from the lack of flexibility of thick conductors needed to carry large amounts of current and from the difficulty encountered in preparing such conductor ends for coupling to electrical apparatus. In the past it was found that in order to increase the current-carrying capacity of a printed circuit cable, it became obviously necessary either to increase the conductor widths or to increase the conductor thicknesses. The former is often unsatisfactory where the space requirements are rigid and the latter is impractical in those cases where flexibility is needed. In most printed circuit assemblies, however, the requirement of flexibility has had to yield to that of size. This, therefore, has resulted in the usage of printed circuit cables having relatively thick conductors in those situations where a high current-carrying capacity is needed. Inherent in the use of cables having thick conductors is the difficulty of preparing the conductor ends for coupling to electrical apparatus as, for example, stripping the conductor ends for attachment to a connector or terminal.

It is, therefore, an object of the present invention to provide an improved, flexible, printed circuit cable adapted for simplified coupling to electrical apparatus.

It is a further object of this invention to provide an improved, flexible, printed circuit cable.

Yet another object of this invention is to provide an improved, flexible, printed circuit cable of high current-carrying capacity.

In accordance with the present invention, there is provided a printed circuit article comprising a flat, flexible sheet of plastic insulating material. Encapsulated within the sheet of plastic insulating material to provide a flexible printed circuit of high current-carrying capacity are a plurality of congruent, flexible, elongated, planar conductors superimposed upon one another.

As used herein, the term "plastic" includes a synthetic organic material of high molecular weight and which, while solid in the finished state, at some stage in its manufacture is soft enough to be formed into shape by some degree of flow.

The well-known term "Teflon" as used herein is the trademark of the E. I. du Pont de Nemours & Company, Inc. and refers to the plastic polytetrafluoroethylene as manufactured by them.

The well-known term "Kel-F" as used herein is the trademark of The M. W. Kellogg Company and refers to the plastic polymonochlorotrifluoroethylene as manufactured by them.

The term "ethylene" includes all those plastic materials containing an ethylene radical and the term "vinyl" includes all those plastic materials containing a vinyl radical.

The term "Saran," trademark of the Dow Chemical Company, is used herein to denote those plastic materials containing a vinylidine radical.

The term "nylon" as used herein refers generically to the group of plastic materials known as polyamides.

For a better understanding of the present invention, together with other and further objects thereof, reference is made to the following description taken in connection with the accompanying drawings and its scope will be pointed out in the appended claims.

Figure 1:
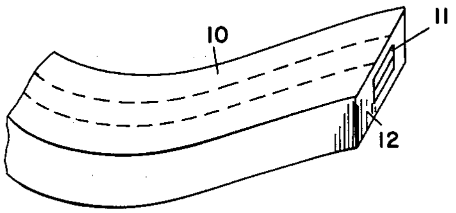
Fig. 1 is a perspective view of a printed circuit cable fragment embodying the conductor structure of the present invention.

Referring now to Fig. 1 of the drawings, there is here shown a flat, flexible, printed circuit cable 10 having a two-layer conductor 11 encapsulated within a plastic insulating material 12. This structure is characterized by the fact that the conductor 11 adheres firmly to the encapsulating plastic 12, but the individual layers of conductor 11 do not adhere to each other and are readily separable. This structural quality gives rise to the use of a laminate conductor 11 where both flexibility and high current-carrying capacities are desired. The current-carrying capacity of such a conductor is, of course, a function of its cross-sectional area. On the other hand, however, the flexibility of conductors of great cross-sectional area is reduced as the thickness is increased. Although extremely wide conductors may have high current-carrying capacities, they are not practical where space requirements must be met. The laminate structure shown in Fig. 1 presents a solution to both the problem of flexibility and high current-carrying capacity by providing a plurality of conductive layers. This results in greater flexibility than a solid conductor by virtue of the fact that the conductor layers are not firmly bonded together and therefore move with respect to each other when the cable is flexed.

Figure 2:
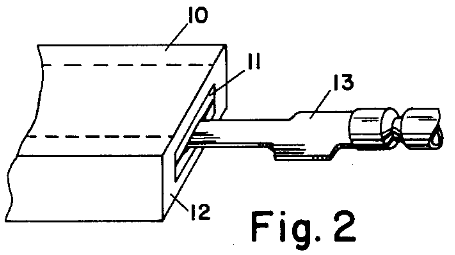
Fig. 2 is a perspective view of the printed circuit cable fragment and conductor structure of Fig. 1 illustrating the insertion therein of a jack.

Another desirable feature of the laminate conductor construction is illustrated in Fig. 2. Here a jack 13 is shown being inserted between the layers of conductors 11. Such a feature is of course unique to the laminate conductor structure and affords a most convenient and rapid means for coupling these conductors to other electrical apparatus.

Figure 3:
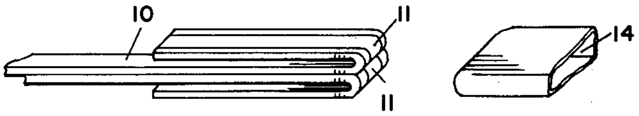
Fig. 3 is a perspective view of the printed circuit cable of Fig. 1 illustrating peeling back of the conductors to form a jack.

Fig. 3 illustrates still another unique feature of the laminate conductor structure. Here there is shown in perspective the printed circuit cable of Fig. 1 with the conductor layers separated and peeled back. This technique may be used either to expose a clean conductor surface for attachment of a terminal thereto, or, as illustrated, to adopt the peeled back conductors 11 for insertion into an aperture 14 much the same as is done with a jack.

Figure 4:
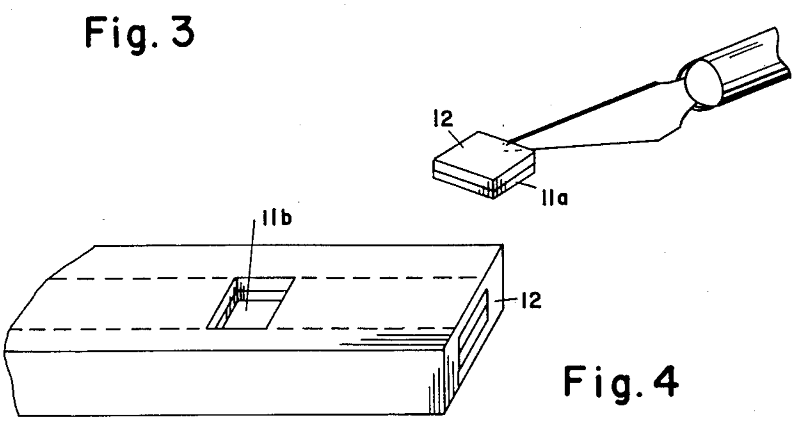
Fig. 4 is a perspective view of the printed circuit cable of Fig. 1 illustrating the removal of insulation and a section of one conductor layer to present a clean surface of conductor to which a connection may be made.

Yet another feature of this conductor structure is illustrated in Fig. 4. Here a section of cover insulation 12 and outside conductor layer 11a is removed to expose the clean surface on the adjacent conductor layer 11b. Such a procedure provides a quick and convenient method of providing a clean conductor surface to which a connection may be made.

Figure 5:
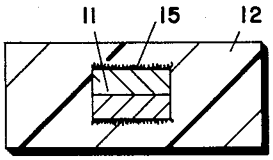
Fig. 5 is a detail elevational view in cross section of the cable conductor structure of Fig. 1.

While applicant does not intend to be limited to any particular materials in the manufacture of the article of this invention, the combination of copper conductors with polymonochlorotrifluorethylene insulation has been found to be particularly useful. For example, the printed circuit cable may be formed from one ounce (1.37 mil) copper conductors having an adherent coating of black cupric oxide formed by oxidation in a chemical bath. These conductors are then readily laminated between two to five mil (0.002–0.005 of an inch) sheets of polymonochlorotrifluoroethylene. Fig. 5 particularly illustrates the laminate structure showing in cross section the copper conductors 11, the cupric oxide coating 15, and the polymonochlorotrifluoroethylene insulation 12. Other plastic materials that have been successfully employed to produce the article of this invention include polyethylene, Teflon, polyvinyl acetate, and polyvinyl chloride; however, as stated above, it is believed that this principle applies broadly to all plastics and applicant does not intend to be limited to those cited in the examples.

To illustrate more completely the methods and types of materials that may be used to manufacture the article of this invention, there follow several examples:

*Polymonochlorotrifluoroethylene-copper printed circuit article*

Figure 6:
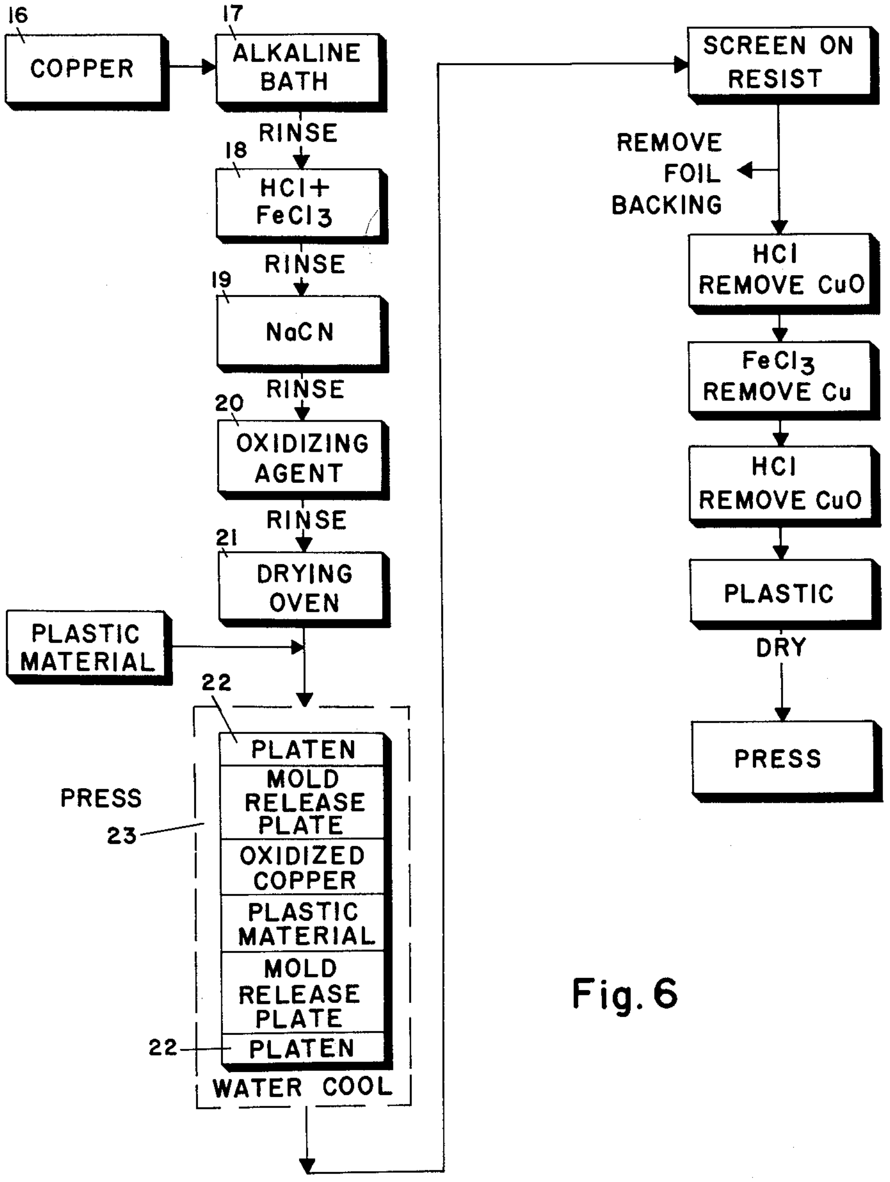
Fig. 6 is a flow chart illustrating a preferred process for manufacturing the article of the present invention.

Referring now to Fig. 6, a flow chart for a method of manufacturing the printed circuit article of this invention is illustrated. For a plastic such as polymonochlorotrifluoroethylene, the method is carried out in detail in the following manner:

Sheets of copper 16 are:

(1) Immersed in a mild alkaline bath 17, such as Dy-Clene EW Metal Cleaner, as manufactured by MacDermid, Inc., of Waterbury, Connecticut, for five seconds;

(2) Rinsed in cold, running water for five seconds;

(3) Dipped for 15 seconds in a 10 percent solution of hydrochloric acid (HCl) 18 contain a small amount of ferric chloride ($FeCl_3$);

(4) Rinsed in cold, running water for five seconds;

(5) Immersed in a 10 percent solution 19 of sodium cyanide (NaCN) for 15 seconds and then rinsed;

(6) Immersed for 10 minutes at 190° F.–210° F. in an oxidizing agent 20, such as an aqueous solution of 1 and ½ pounds of Ebonol "C" Special, as manufactured by Enthone, Inc., New Haven, Connecticut, per gallon of water. The oxidizing agent is preferably a hot aqueous solution consisting essentially of an alkali selected from the group consisting of sodium hydroxide and potassium hydroxide and a chlorite selected from the group consisting of sodium chlorite and potassium chlorite.

(7) Immersed in cold, running water;

(8) Rinsed in hot, running water for 10 to 20 seconds; and (9) Baked in a preheated oven 21 at a temperature above 212° F. until all traces of moisture are removed.

These steps result in providing a sheet of copper having a cupric oxide surface obtained by utilizing a chemical agent rather than by applying heat as in the prior art. The cupric oxide obtained in the manner described in steps 1 to 9 above is quite different from that obtained by heating. It appears as a homogeneous, velvety black coating. The black is intense. Under a microscope of greater than 300 power, the crystals of oxide appear fine and needle-like and in a much thinner layer than that obtained when copper is heated. Further, and probably most important, this cupric oxide differs from that obtained by heating in that it is tightly bonded to the copper and will not flake off.

The copper sheets by means of steps 1 to 9 above are now ready for lamination to a plastic. The lamination process is, for example, as follows:

(10) Place a sheet of thin, metallic-foil mold release plate, such as aluminum, on the platen of a press 23, such as manufactured by Wabash Press Company, Wabash, Indiana; the aluminum foil is used to prevent adherences between the polymonochlorotrifluoroethylene and the platen;

(11) Place a lamination of a sheet of plastic material on the platen 22 of the press 23. This lamination may have as many layers as desired, for reasons to be considered more fully hereinafter. The plastic may be, for example, polymonochlorotrifluoroethylene and each sheet may be, for example, 6 inches long, 2 inches wide and 2 mils thick. The temperature of the oven is, for example, 400° C.

(12) Place a sheet of copper, coated in accordance with steps 1 to 9 on top of a polymonochlorotrifluoroethylene layer of the laminate and apply an initial pressure of approximately 5 pounds per square inch, gradually increasing the pressure;

(13) Bake under pressure at 216° C. to 219° C. for 40 seconds;

(14) Remove the copper clad plastic from the press and quench in cold water; and

(15) Remove the aluminum foil.

The plastic can, of course, be copper clad on both sides merely by placing sheets of copper both above and below the plastic. Similarly, a number of sheets of plastic may be intermixed with cupric oxide coated sheets of copper to form a laminated structure.

The bond strengths obtained as measured by delaminating a one inch strip of copper from the polymonochlorotrifluoroethylene are consistently greater than 8 pounds per inch. Bond strengths of 18 pounds per inch and higher are obtainable. For example, laminates prepared by starting with the polymer powder as indicated above are characterized by bond strengths which are consistently in excess of 5 pounds per inch.

More specifically, to manufacture the article of the present invention, the copper of the article prepared in the manner described above may be treated as indicated in the remainder of the flow chart of Fig. 6. A resist is placed on the copper in the pattern of a desired configuration and the excess removed by a suitable etching technique. The remaining resist is removed and the copper configuration cleaned on the exposed surface. This etching process is then repeated on a second sheet of copper-clad plastic to form a mirror image of the configuration of the first sheet of copper-clad plastic. After preparing the second sheet of copper-clad plastic and cleaning the outer copper surface thereof, the two configurations are superimposed upon each other so that the respective clean copper surfaces are in contact and in accurate alignment. This assembly may then be fixed and sealed by means of heat and pressure in the manner described above.

*Polytetrafluoroethylene-copper printed circuit article*

Using the same apparatus and general procedure as outlined in Fig. 6, and differing only in the plastic to copper bonding process, a thin sheet of Teflon, for example under 0.010 inch thick, is placed in contact with a sheet of cupric oxide coated copper foil, for example 2 ounces (2.7 mil) copper, and placed in the press 23. The plastic-copper laminate is preheated at approximately 700° F. for several minutes and then pressed at that temperature and in the order of 250 pounds per square inch pressure for about 6 minutes. The laminate is then water cooled in the press under continued pressure. Bond strengths have been observed as high as 8 pounds per inch.

The present invention presents an important step forward in the art of printed circuitry, in that the dielectric and flexibility properties of plastic materials may be successfully utilized.

While there has been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What I claim is:

1. A male electrical circuit connector, comprising: a flat, flexible sheet of thermoplastic, organic plastic insulating material; and a pair of congruent, flexible, elongated, planar conductors superimposed upon one another and encapsulated within said sheet of plastic insulating material, the ends of said conductors being separated and peeled back onto the outer insulation covering to provide a male connector for insertion into a female connector.

2. An electrical circuit connection, comprising: a flat, flexible sheet of thermoplastic organic plastic insulating material; a pair of congruent, flexible, elongated, planar conductors superimposed upon one another and encapsulated within said sheet of plastic insulating material, said conductors extending to an edge of said flat sheet; and an electrical jack inserted between said conductors along the longitudinal direction thereof to form said electrical circuit connection.

References Cited in the file of this patent

UNITED STATES PATENTS

| | | |
|---|---|---|
| 2,200,776 | Hoover | May 14, 1940 |
| 2,254,280 | Gottheimer | Sept. 2, 1941 |
| 2,308,324 | Benander | Jan. 12, 1943 |
| 2,540,101 | Colman | Feb. 6, 1951 |
| 2,745,898 | Hurd | May 15, 1956 |
| 2,757,349 | Erbal | July 31, 1956 |
| 2,793,333 | Ehlers | May 21, 1957 |
| 2,854,502 | Richter | Sept. 30, 1958 |

OTHER REFERENCES

Electronics (publication), December 1955, page 313.